United States Patent [19]
Laird

[11] Patent Number: 5,557,635
[45] Date of Patent: Sep. 17, 1996

[54] VOICE ENCODE/DECODE SUBSYSTEM IN A SYSTEM FOR ACQUISITION OF TEST DATA USING PULSE CODE MODULATION

[75] Inventor: Daniel T. Laird, Victorville, Calif.

[73] Assignee: The United States of America as represented by the Secretary of the Air Force, Washington, D.C.

[21] Appl. No.: 313,972

[22] Filed: Sep. 28, 1994

Related U.S. Application Data

[63] Continuation-in-part of Ser. No. 183,618, Jan. 12, 1994, abandoned.

[51] Int. Cl.[6] .................................................. H03M 7/32
[52] U.S. Cl. ............................. 375/250; 341/77; 341/143
[58] Field of Search .................................. 375/238, 247, 375/250, 251; 341/77, 143, 61; 381/36; 395/2.79

[56] References Cited

U.S. PATENT DOCUMENTS

| | | | |
|---|---|---|---|
| 3,979,676 | 9/1976 | Poma | 325/38 B |
| 4,035,724 | 7/1977 | Stephenne et al. | 375/251 |
| 4,044,306 | 8/1977 | Villeret et al. | 375/250 |
| 4,281,994 | 8/1981 | Dell et al. | 434/49 |
| 4,359,603 | 11/1982 | Heaton | 370/62 |
| 4,450,554 | 5/1984 | Steensma et al. | 370/4 |
| 4,803,726 | 2/1989 | Levine et al. | 380/48 |
| 4,996,696 | 2/1991 | McCabe | 375/30 |

OTHER PUBLICATIONS

Daniel T. Laird, Pragmatic Design, Design Test Expo, Jan. 12–14, 1993, pp. 1–4.

Primary Examiner—Stephen Chin
Assistant Examiner—Timothy J. May
Attorney, Agent, or Firm—Bernard E. Franz; Thomas L. Kundert

[57] ABSTRACT

The encode and decode subsystems use a continuously variable slope delta-modulation (CVSD) approach, with either parallel or serial data transfers. To allow for synchronization with a stable data transfer, the entire subsystem uses the main acquisition systems bit rate clock (BRC) as a basis. All other clocks required are simply divided down versions of the BRC and a request pulse from the main system to transfer the data. The delta-modulator is clocked at a rate commensurate with the word placement in the minor frame of the data acquisition cycle; the NRZ-L bits are clocked into serial-to-parallel registers, then latched into the parallel discrete interface (PDI) unit of the main data system. For a serial feed, a similar situation is possible by clocking the data off the circuit board into a serial discrete interface (SDI) unit. The request pulse that activates, the transfer is synchronized with the BRC to ensure a stable transfer. The decoder uses the same CVSD integrated circuit to decode the digital data. The decoder is able to lock onto the data stream as a parasitic extension of a standard PCM decommutator. To locate the data and establish the necessary clocking, the standard word rate clock (WRC), frame rate clock (FRC), and the BRC of the decommutators are used.

5 Claims, 14 Drawing Sheets

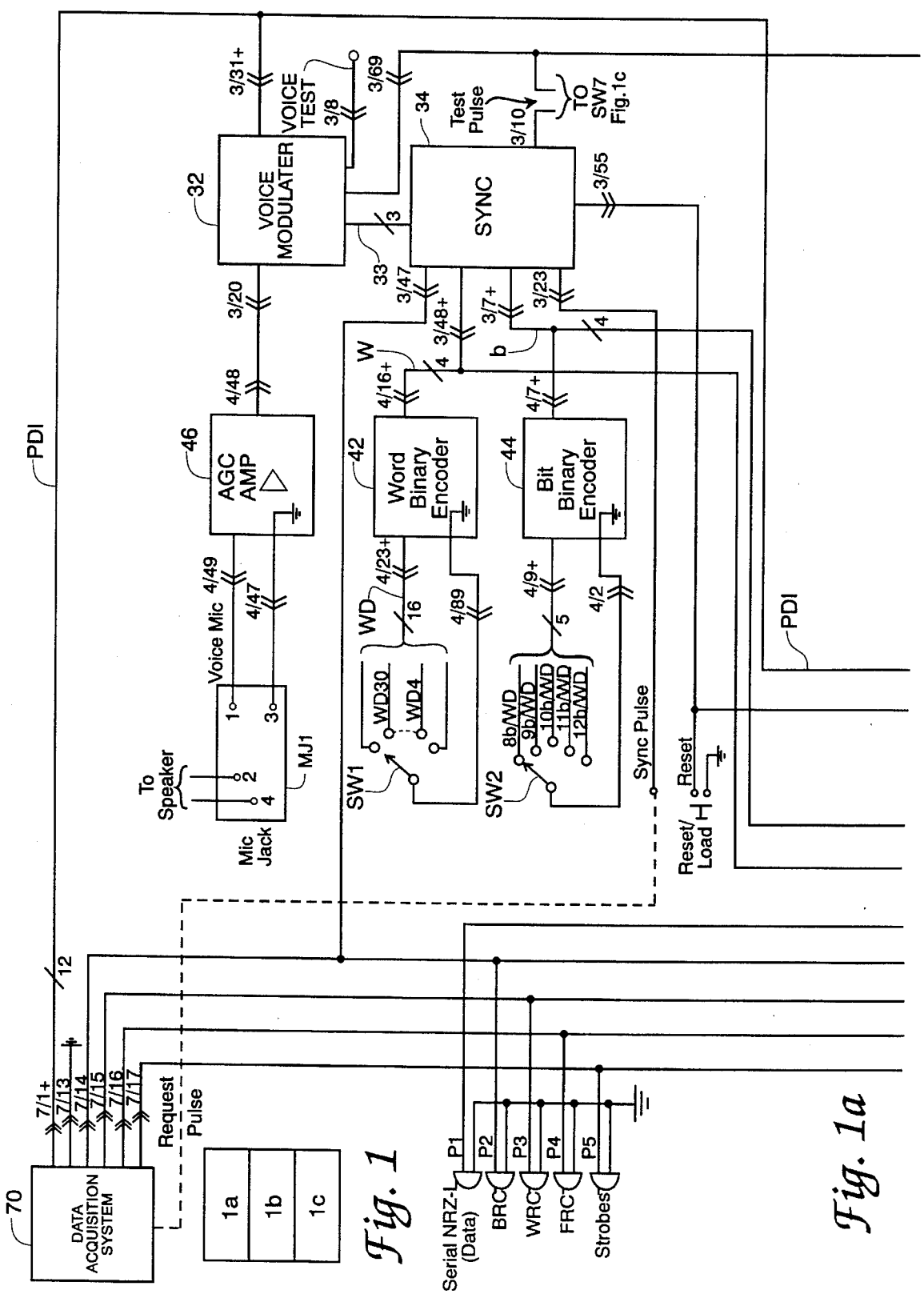

VOICE ENCODE TIMING
VARIOUS CLOCKINGS

EXAMPLE TIMING (12 BITS)

EVERY 8TH WORD PLACEMENT
* TIME DELAYS RANGE 9ns-35ns

VOICE ENCODE TIMING
VARIOUS CLOCKINGS

EXAMPLE TIMING (12 BITS)

EVERY 4TH WORD PLACEMENT
* TIME DELAYS RANGE 9ns-35ns

VOICE ENCODE/DECODE SUBSYSTEM IN A SYSTEM FOR ACQUISITION OF TEST DATA USING PULSE CODE MODULATION

RIGHTS OF THE GOVERNMENT

The invention described herein may be manufactured and used by or for the Government of the United States for all governmental purposes without the payment of any royalty.

RELATED APPLICATION

This is a continuation-in-part of my application Ser. No. 08/183,618, filed Jan. 12, 1994, hereby incorporated by reference, and now hereby abandoned.

BACKGROUND OF THE INVENTION

The present invention relates generally to a voice encode/decode subsystem, and move particularly to an adaptive Delta Modulation (ADM) technique that is used to encode and decode voice for PCM transmission.

In the field of aircraft testing the need to efficiently record the cockpit voice communication without consuming a significant amount of the acquisition frame bandwidth has been an issue for years. There are methods, based on commercially available products, that allow for voice placement into PCM streams that will satisfy the requirement of relatively low bandwidth consumption. The present invention relates to a design that makes minimal demand on bandwidth, with the freedom to vary the placement of the voice within the minor acquisition frame.

The data acquisition system this subsystem was built to integrate into is called the Airborne Test Instrumentation System (ATIS) designed and developed by SCI in Huntsville, Ala. The system consists of Format, or System Control Unit and Analog and Digital Remote Units and a Data Bus Interface Unit. Data is captured in synchronization with a system base clock called a bit rate clock (BRC) that is generated by an oscillator within the Format or System control unit. Once captured the data may be sent to a recorder, or a telemetry subsystem for transmission. There is a limited on board monitoring subsystem to sample some of the parameters in "real-time".

There are various methods to acquire voice for placement into a data acquisition PCM stream for recording and/or transmission. Methods such as analog modulations via VCOs place voice on its own track on a storage medium, and standard sample and hold code a magnitude over $2^n$ levels. These methods either degrade quality, inefficiently use storage space, or consume severely needed channel bandwidth. It can integrate into any system that uses a request pulse for serial or parallel acquisition of TTL signals.

Of the many ways to convert an analog signal to digital, one means that allows for a relatively small bandwidth is Delta Modulation (DM). In PCM the sampled signal is quantified into L levels and transmits as $n=\log_2 L$ pulses per sample. In DM we are encoding only the difference in successive signals. So, basically, DM carries information about the derivative, or slope of the signal. Therefore, we are encoding information in one pulse instead of n pulses. This is a great savings in bandwidth, but there is a trade-off with quantization error. This is overcome by sampling faster, usually 4–8 times higher than PCM. The bare bones method isn't very practical. References:

1. Taub, Herbert, 1918-Principles of Communications Systems McGraw Hill; 1986, 1971

2. Lathi, B. P. Modern Digital and Analog Communications Systems CBS College Publishing; 1983

SUMMARY OF THE INVENTION

An objective of the invention is to provide an encode/decode subsystem to integrate voice into a data acquisition system pulse code modulation (PCM) stream. There were two major problems to solve: synchronization for the transfer to stable data and confirmation of a viable transfer. The underlying requirements set for this design were simplicity, versatility, and verifiability.

According to the invention, the encode and decode subsystems use a continuously variable slope delta-modulation (CVSD) approach. Using this well known method, I am actually encoding the derivative or slope of the analog data into a digital format. In keeping with my commitment to versatility, I allowed for either parallel or serial data transfers. The CVSD integrated chip has a serial nonreturn-to-zero (NRZL) output for the digitized signal. This serial data can be output directly from the circuit board or a parallel feed is possible using serial-to-parallel registers.

The CVSD chip is the heart of the encode and decode subsystems. To allow for synchronization with a stable data transfer, the entire subsystem uses the main acquisition systems bit rate clock (BRC) as a basis. All other clocks required are simply divided down versions of the BRC and a request pulse from the main system to transfer the data. The idea is simple, the delta-modulator is clocked at a rate commensurate with the word placement in the minor frame of the data acquisition cycle; the NRZ-L bits are clocked into serial-to-parallel registers, then latched into the parallel discrete interface (PDI) unit of the main data system. For a serial feed, a similar situation is possible by clocking the data off the circuit board into a serial discrete interface (SDI) unit. The request pulse that activates, the transfer is synchronized with the BRC to ensure a stable transfer. I performed a hard check of the request pulses against the main system BRC to ensure that no transitions would take place during the data capture. This design incorporates two test modes; one internal for a quick voice qualify check, and one to be used only with the decoder. Because of a unique feedback feature of the CVSD chip, only an amplifier is necessary to check the encoding quality of the encoder circuit board.

The decoder uses the same CVSD integrated circuit to decode the digital data. The primary design requirements here were PCM synchronization for a stable data capture. The decoder is able to lock onto the data stream as a parasitic extension of a standard PCM decommutator. To locate the data and establish the necessary clocking, for the timing subsystem I exploited the standard word rate clock (WRC), frame rate clock (FRC), and the BRC of the decommutators used at the Flight Test Center. Again the idea is simple; an FRC loads a word counter, which in turn, counts the words to a preprogrammed value, then transfers the data from the PCM stream to a set of parallel-to-serial or serial-to-parallel registers. These registers are then clocked into the CVSD chip using a divided down version of the BRC. The decoder is configured as four separate circuit boards; power, timing and data extraction; demodulation; and another for amplification and encoding. A rotary switch is used to convert front panel selections to the required binary values for the counters.

BRIEF DESCRIPTION OF THE DRAWINGS

FIGS. 1a–1c, when arranged as shown in FIG. 1, comprise a functional block and schematic diagram of the voice encode/decode subsystem.;

FIGS. 2 and 3, with FIG. 3 arranged below FIG. 2, comprise a functional block and schematic diagram of a voice encoder PC card, with FIG. 2 showing the voice modulator 32 and FIG. 3 showing the synchronization circuits 34 of FIG. 1a;

DETAILED DESCRIPTION

I. INTRODUCTION

Figure 1B:
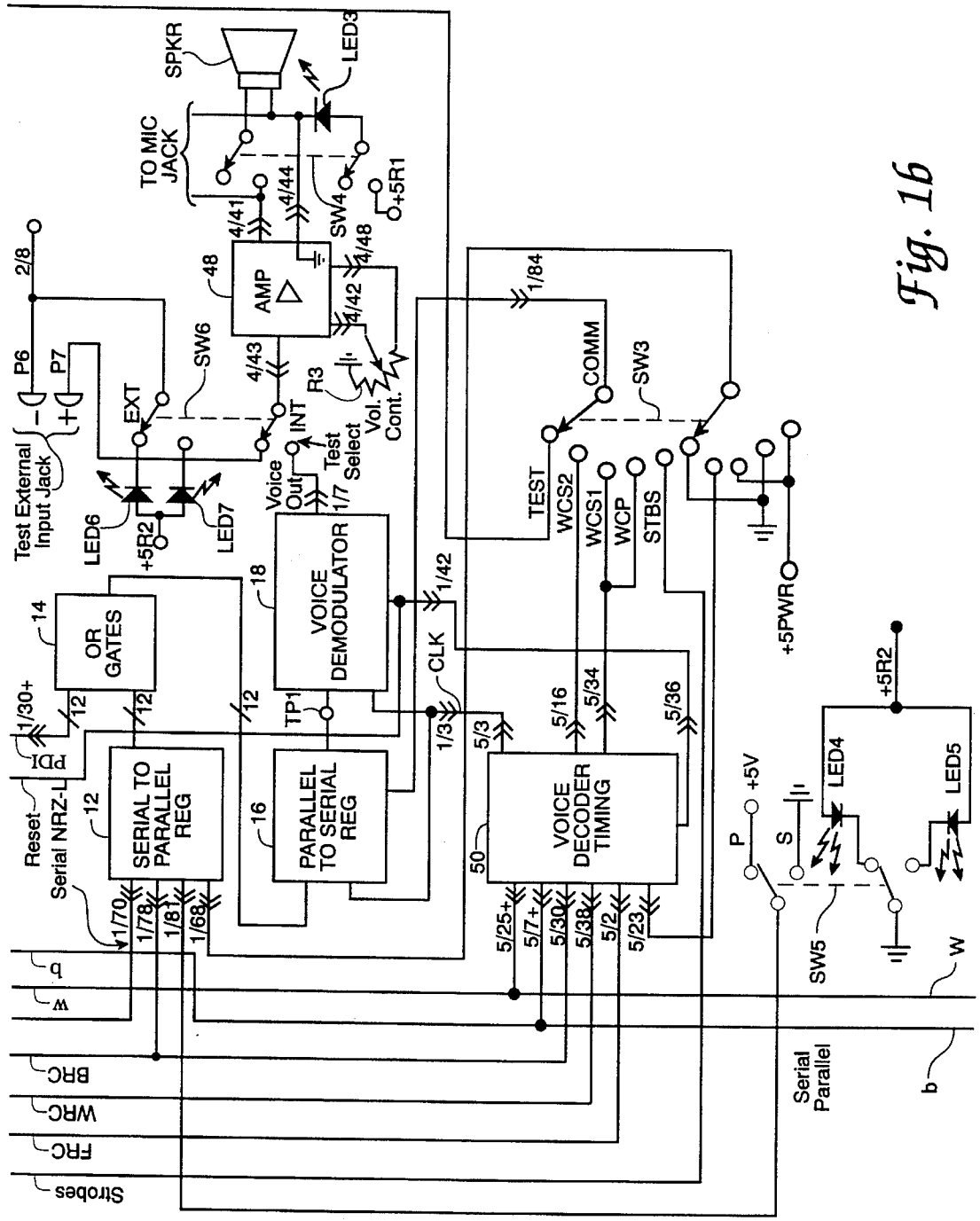

1. To integrate voice into a PCM stream, for either recording or telemetry, requires a subsystem that can transform the analog voice, over a restricted bandwidth (usually 400–4 kHz) into a digital representation. There are many techniques and methods to do the transformation; let's briefly review some popular means.

2. When sampling rate is not a constraint, on the upper bound, a simple $2^n$ level quantization analog to digital ((A/D) conversion is popular. For sampling systems we would require a minimum bandwidth (B) of $$B=2\times f_v$$

$f_v$=4 kHz. (voice band)

For eight bits per sample we would need to sample at least 8×8 KHz, at this rate.

$$B=64 \text{ kHz.}$$

As the number of bits per word in the system increase the bandwidth requirements increase in a linear fashion. For an eight bit system each bit carries a weight (in volts) of:

$$V_{bit}=\frac{V_o}{2^8}=\frac{V_o}{256}$$

where Vo is the voltage range used to encode the data.

For the ATIS systems used at Edwards Air Force Base, a bit rate of 128 kbs at 12 bits per word (12 bs/w) is standard for system clocking. At this rate a twelve bit A/D converter would have to be sampled at:

$$2\times 4 \text{ } k\times 12=96 \text{ kbs.}$$

Obviously, this is inadequate to encode voice in a 128 Kbs system!

3. Of the many ways to convert an analog signal to digital, one means that allows for a relatively small bandwidth is Delta Modulation (DM). A means to a slower sample rate that still satisfies Nyquist criterion is to have a difference signal (that relates the sampled input to the output via feedback) encoded into just one bit. The basic delta modulator consists of a comparator and a sampler in the direct path and an integrator in the feedback path. The analog signal m(t) is compared to the feedback signal $\overline{m}(t)$, the error signal $e(t)=m(t)-\overline{m}(t)$ is then applied to the comparator. The output of the comparator is $$m_0(t)=A \text{ sgn } (e(t))$$

The sampler runs at the rate $f_s>>2f_B$ where fB is the voice bandwidth. We can see that the output is a pulse train, d(t), dependent on sgn (e(t)). By simply low pass filtering the $\overline{m}(t)$ we smooth this signal and approximate m(t).

In PCM the sampled signal is quantified into L levels and transmits as $n=\log_2 L$ pulses per sample. The DM we are encoding only the difference in successive signals. So, basically, DM carries information about the derivative, or slope of the signal. Therefore, we are encoding information in one pulse instead of n pulses. This is a great savings in bandwidth, but there is a trade-off with quantization error. This is overcome by sampling faster, usually 4–8 times higher than PCM. The bare bones method isn't very practical.

In this scheme of modulation, the baseband signal m(t) and the quantized output approximation $\overline{m}(t)$ are electronically compared. The basic idea is simple; if $m(t)>\overline{m}(t)$ then the comparator system outputs a positive pulse to a clock that counts "up". When the $m(t)<\overline{m}(t)$, the complimentary result follows.

Two other problems with DM are threshold and overloading. The variations of m(t) smaller then the step value (threshold of coding) are lost. Also signals that change too quickly (high slope) result is $\overline{m}(t)$ lagging m(t). This is an overloading limit of the slope. This is the basic limiting factor of DM.

During a sample time (Ts), $\overline{m}(t)$ can change by Δ, hence the maximum slope m(t) can follow is Δ/Ts or Δfs. Therefore no overload occurs if $$|\dot{m}(t)|<\Delta fs$$

For a tone modulation m(t)=Acosωt this yields $$A_{max}=\frac{\Delta fs}{W}$$

It has been shown for voice we can use a limit of $$[A_{max}]_{voice}=\Delta fs/w_r; \text{ } w_r=2\times\pi\times 800 \text{ Hz}$$

It turns out that the dynamic rage of amplitudes is too small, because of threshold and overloading, to adequately encode a voice signal. To correct this deficiency of type of compression on Δ is needed. We want to increase Δ where m(t) is changing rapidly, and conversely, decrease Δ while m(t) is slowly changing. In Adaptive Delta Modulation (ADM) a circuit detects the overload and threshold conditions and adjust the step size Δ. There are basically two categories of ADM: Continuous and Discrete. I've used a continuous method.

There are several methods for adjusting the step size Δ. For the HC-55564 that I use the feedback path includes a 3 bit algorithm that monitors the last 3 bits in the stream. If coincidence occurs (all 0s or 1s, i.e. slope charging too fast) a step size logic circuit is activated which passes a signal through a syllabic filter. It is the output of this filter that modulates the NRZ-L to give the step size Δ. This modulated signal is finally passed through an estimate filter, D/A converted and fed back to the input comparator. The D/A signal is also available as a test of the voice quality.

II. DESCRIPTION

Figure 1C:
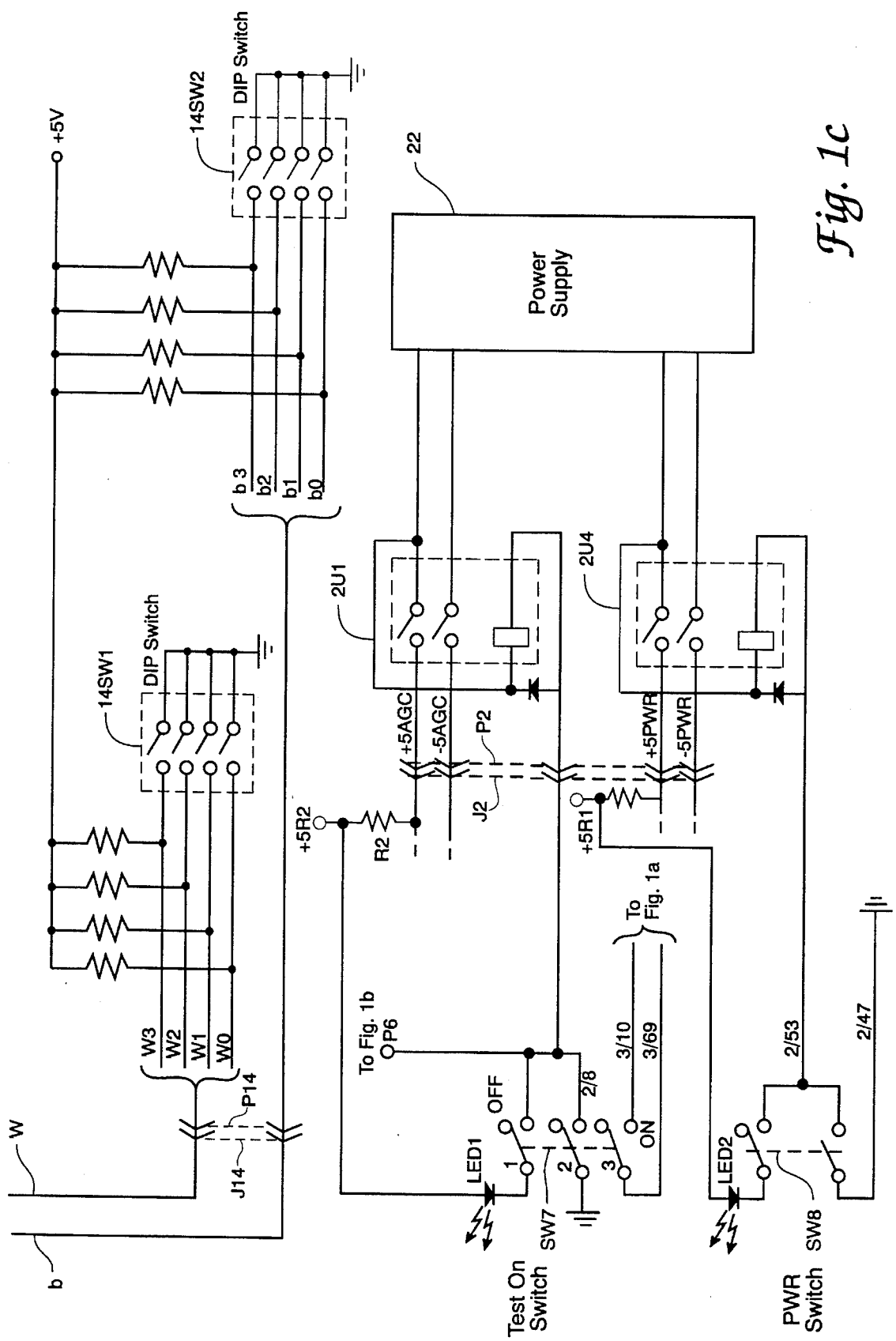

FIGS. 1a–1c, when arranged as shown in FIG. 1, comprise a functional block and schematic diagram of the voice encode/decode subsystem, working with a data acquisition system 70.

The encode/decode subsystem comprises a mother board 10 with jacks. Some of the jacks receive printed circuit boards having corresponding plugs. There are also a number of front panel controls and indicators on the mother board. In the drawings, the plugs and corresponding jacks are connectors represented as double arrows on the leads, identified by the connector number, a slash mark, and a pin number. For lines having a number of leads, one pin number is given followed by a plus sign. The principal printed circuit plug in cards are a voice encoder card with plug 3, a voice decoder demodulator card with plug 1, a voice decoder timing card with plug 5, and an AGC/AMP/switching logic card with plug 4. Also as shown in FIG. 1c, there is a card with DIP switches with plug 14, and a power supply card with plug 2. A connector 7 on the mother board provides for a cable to the data acquisition system 70.

The Data Acquisition System (DAS) 70 that this subsystem was built to integrate into is called the Airborne Test Instrumentation System (ATIS) designed and developed by SCI in Huntsville, Ala. The system consists of Format, or System Control Unit (FCU or SCU) and Analog and Digital Remote Units (ARU and DRU) and a Data Bus Interface Unit (DBIU). The DRU comes in two flavors: Parallel Discrete and Serial Discrete Units (PDU and SDU). The PDU can capture parallel words (up to 12 bits in length), or single discrete signals. The SDU can capture words a bit at a time in a serial stream of up to twelve bit words. Each unit captures in synchronization with a system base clock called a bit rate clock (BRC) that is generated by an oscillator within the FCU/SCU. The FCU/SCU samples the ARU DRU, and DBIU within a data format (programmed by a user) of up to 512 words, of maximum length of 12 bits/word for every minor frame. Words, or parameters may be super-commutated, i.e., sampled more than once per frame, or subcommutated, i.e., less than once per frame. The number of minor frames within a major frame is divisible by 2. Once captured the FCU/SCU may send the data to a recorder, or a telemetry subsystem for transmission. There is a limited on board monitoring subsystem to sample some of the parameters in "real-time".

A Standard Decommutator captures a PCM stream and extracts the BRC, the Word Rate Clock (WRC) and the Frame Rate Clock (FRC) and outputs the PCM data and all three clocks. My decoder then uses this available information to synchronize with the data and recover the voice signal from the PCM stream.

The decoder is able to lock onto the data stream as a parasitic extension of a standard PCM decommutator. To locate the data and establish the necessary clocking, I exploited the standard word rate clock (WRC), frame rate clock (FRC), and the BRC of the decommutators used at the Flight Test Center.

The CVSD chip is the heart of the subsystem. This chip along with a related filter chip are represented as a voice modulator block 32 in FIG. 1a. A microphone jack is plugged into pins 1 and 3 of a microphone jack MJ1. Voice signals are coupled via connectors 4/49 and 4/47 to a AGC amplifier 46, and thence via connectors 4/48 and 3/20 to the voice modulator 32. The digitized output on 12 leads is coupled via the connector 3/31+ and line PDI to the data acquisition system 70 for recording (or telemetering).

The synchronization circuits for the voice modulator 32 are represented in FIG. 1a by a block 34. To allow for synchronization with a stable data transfer, the entire 20 subsystem uses the main acquisition systems bit rate clock (BRC) as a basis, supplied via connectors 7/14 and 3/47. All other clocks required are simply divided down versions of the BRC. A request pulse from the main system is used to transfer the data. (The request pulse may be supplied from the Data Acquisition System 70 to the terminal labeled "Sync Pulse", as shown by a dotted line, and forwarded via connector 3/23 to the Sync Unit with the detail shown in FIG. 5a. Parallel input may come either from the voice modulator 32, or from the parallel data interface of the data acquisition decommutator block 70, thence via line PDI to the OR gates 14. Serial NRZ-L data input may be provided via a cable from the data acquisition decommutator unit 70, connected to the plug P1 and the connector 1/70 to the serial-to-parallel register 12. The parallel output from register 12 goes to the OR gates 14. Output from the OR gates 14 goes via a parallel-to-serial register 16, whose output goes via a line having test point TP1 to the voice demodulator 18. With switch SW6 in the INT position, voice output from the voice demodulator 18 goes via connectors 1/7 and 4/43 to an amplifier 48. Output from the amplifier 48, via connectors 4/41 and 4/44, may go either via switch SW4 to a speaker SPKR, or to headphones plugged into the microphone jack MJ1.

Figure 6:
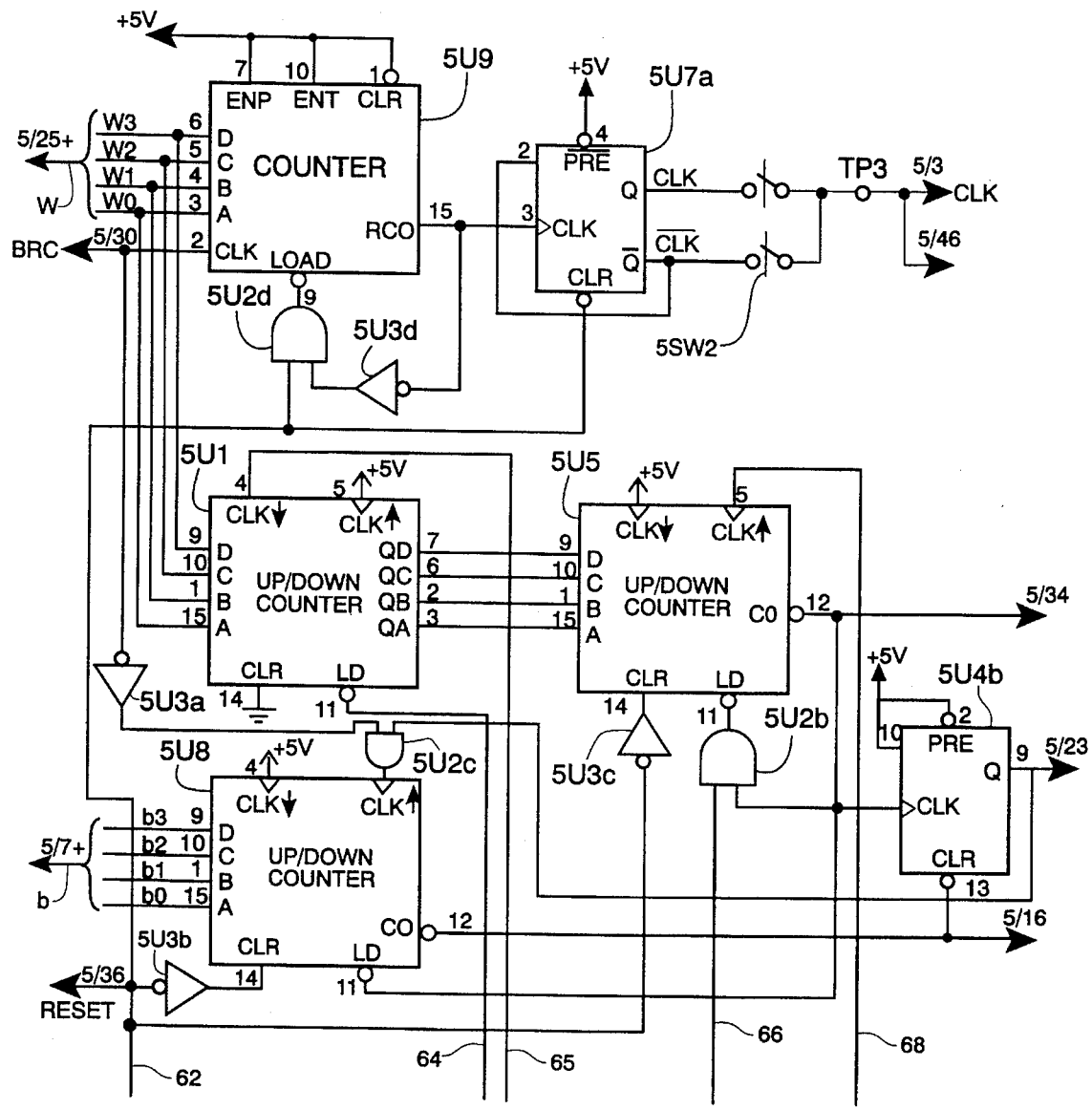
FIGS. 6 and 6a (with FIG. 6a arranged below of FIG. 6) comprise a functional block and schematic diagram of a voice decoder timing (block 50 of FIG. 1b) PC card.
Figure 6A:
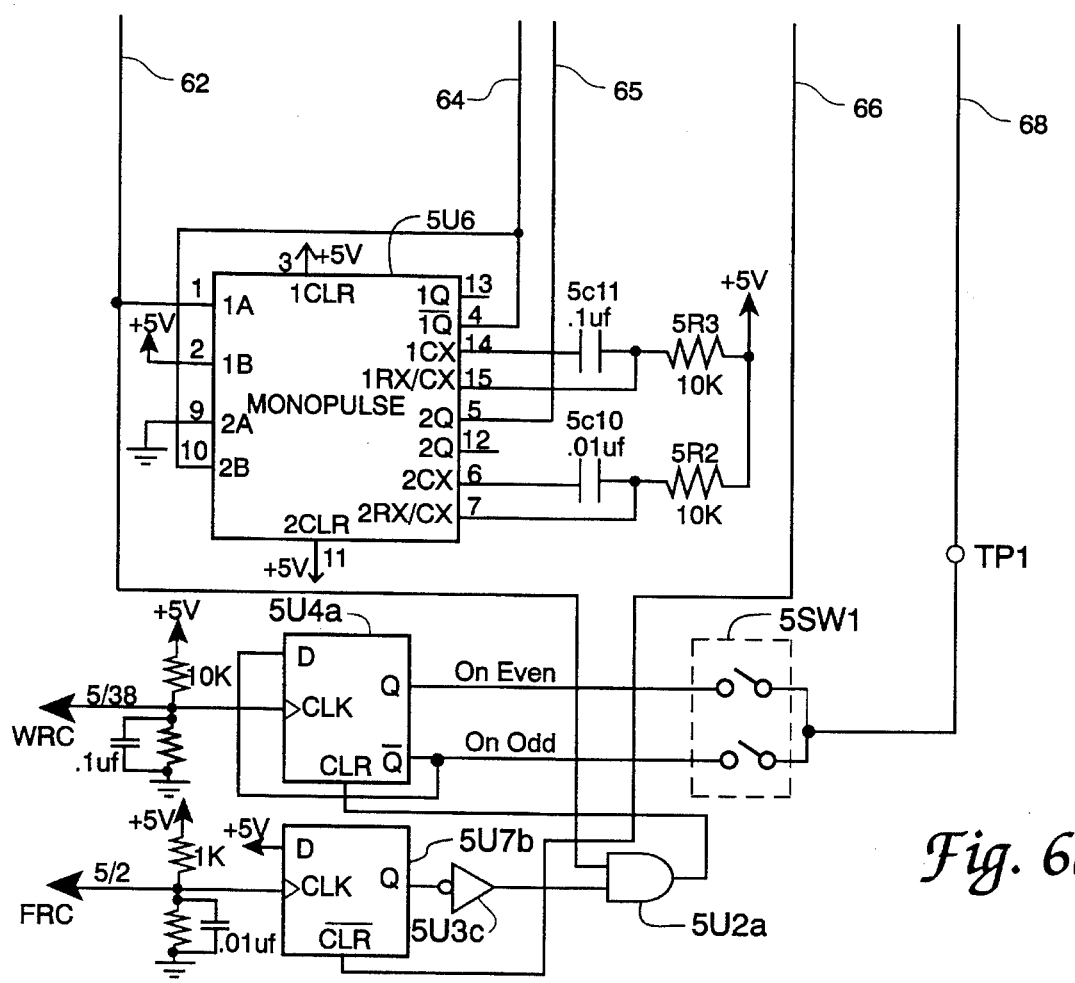
Figure 7:
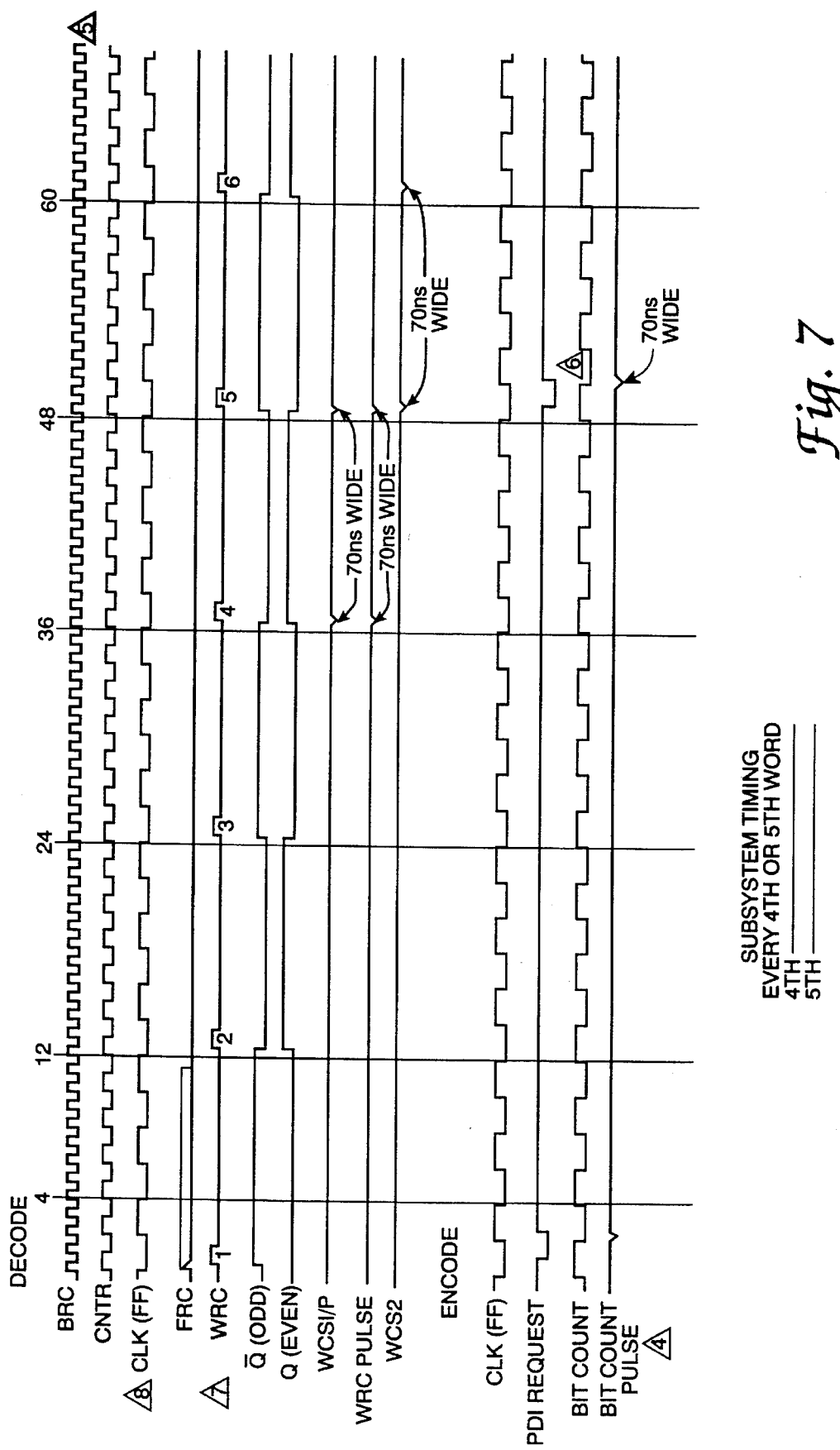
FIG. 7 is a graph of clocks for timing a subsystem.
Figure 8:
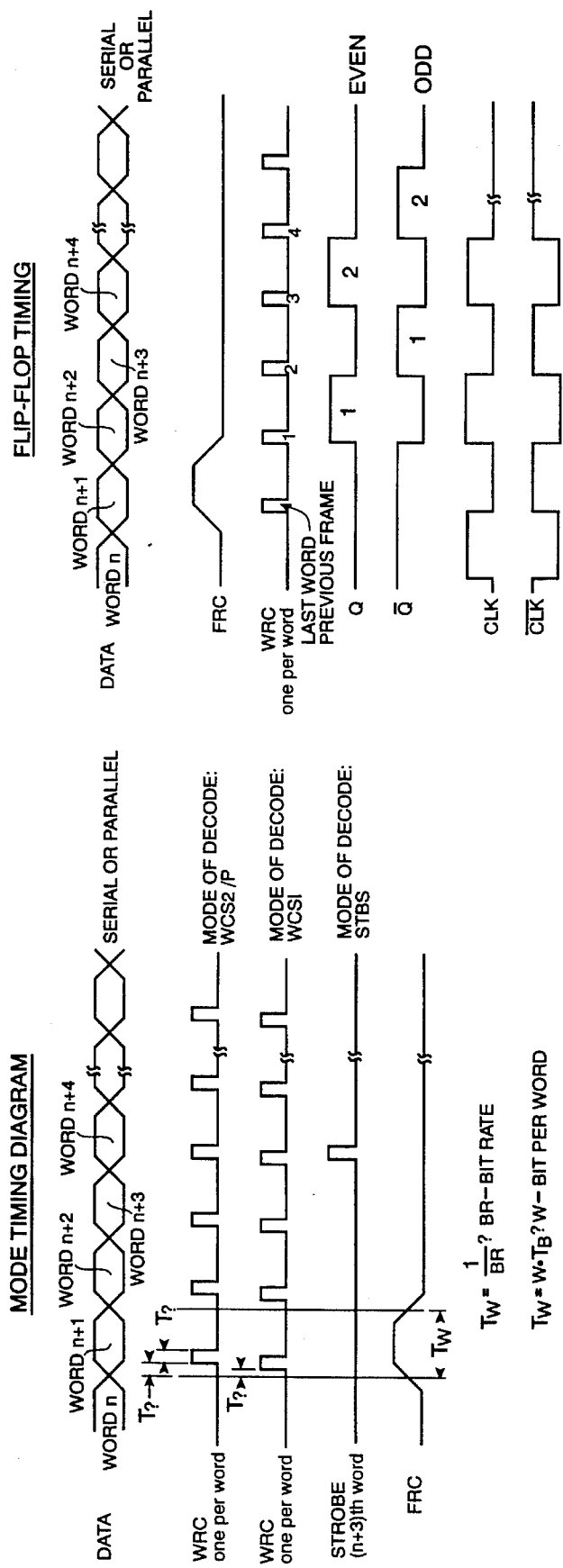
FIG. 8 is a mode timing diagram and a flip-flop timing diagram for the circuit of FIG. 6.

Timing for the decoder is provided via the voice decoder timing block 50, which is shown in detail in FIG. 6. The primary design requirements here were PCM synchronization for a stable data capture. The decoder is able to lock onto the data 20 stream as a parasitic extension of a standard PCM decommutator. To locate the data and establish the necessary clocking, I exploited the standard word rate clock (WRC), frame rate clock (FRC), and the BRC of the decommutators used at the Flight Test Center. These signals are supplied to block 50 via connectors 5/38, 5/2 and 5/30 respectively. Again the idea is simple; an FRC loads a word counter, which in turn, counts the words to a 34.) The idea is simple, the delta-modulator is clocked at a rate commensurate with the word placement in the minor frame of the data acquisition cycle; the NRZ-L bits are clocked into serial-to-parallel registers, then latched into the parallel discrete interface (PDI) unit of the main data system. A 16-position rotary switch SW1 is used to set the word position in a frame, and a 5-position rotary switch SW2 is used to set the number of bits per word. The encoders 42 and 44 encode these values into binary code for the sync circuit 34.

For a serial feed, a similar situation is possible by clocking the data off the circuit board into a serial discrete interface (SDI) unit. The request pulse that activates, the transfer is synchronized with the BRC to ensure a stable transfer.

I performed a hard check of the request pulses against the main system BRC to ensure that no transitions would take place during the data capture. This design incorporates two test modes; one internal for a quick voice qualify check, and one to be used only with the decoder. Because of a unique feedback feature of the CVSD chip, only an amplifier is necessary to check the encoding quality of the encoder circuit board. This feedback feature reconverts the digitized voice back to analog, which is output via connector 3/8.

Figure 4:
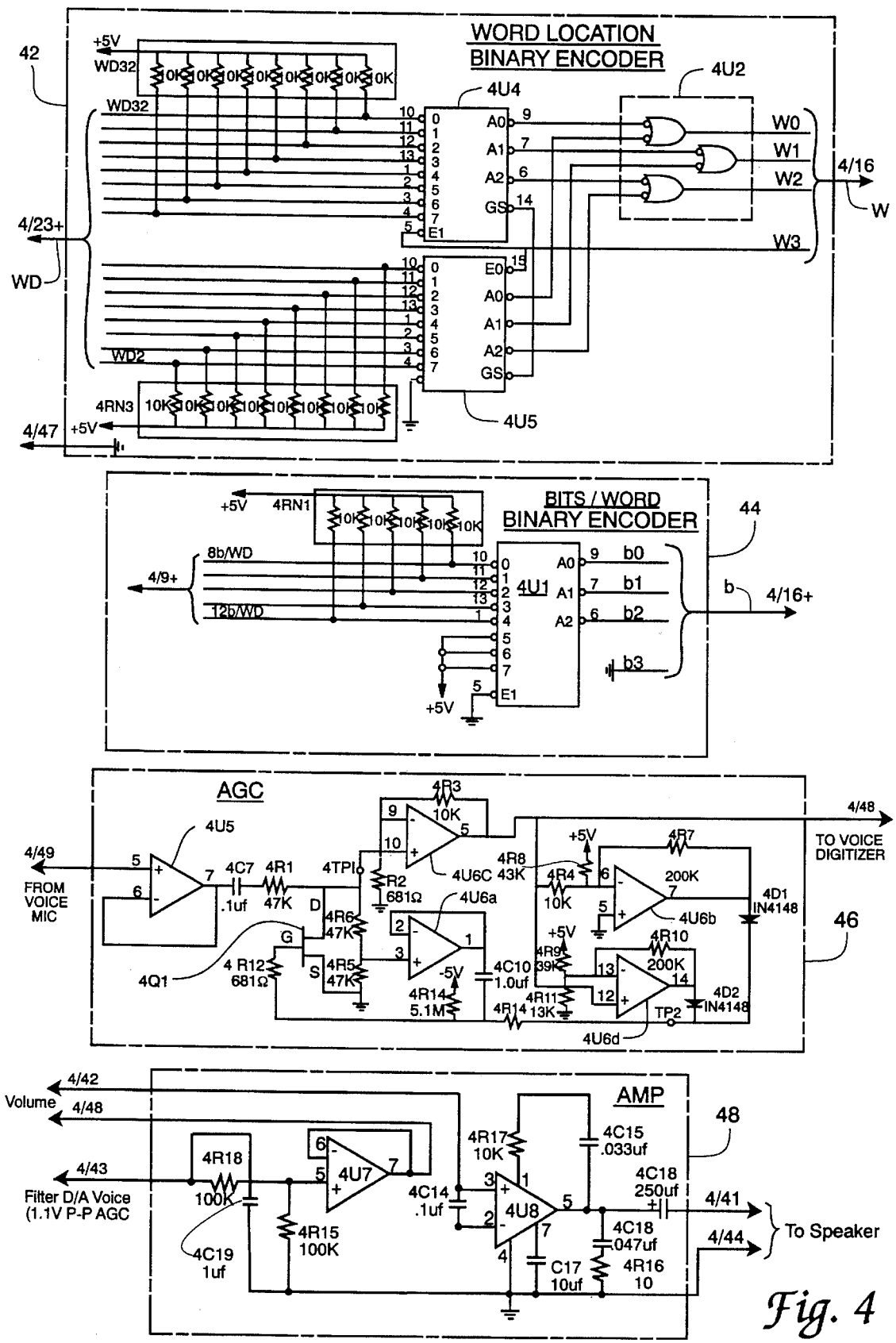
FIG. 4 is a functional block and schematic diagram of a AGC/AMP/switching logic PC card, including the binary encoders 42 and 44, the AGC amplifier 46, and the amplifier 48, of FIGS. 1a and 1b.

The decoder uses the same CVSD integrated circuit to decode the digital data. The CVSD chip along with the corresponding filter are shown as a voice demodulator block 18 in FIG. 1c, preprogrammed value, then transfers the data from the PCM stream to a set of parallel-to-serial registers (16?) or serial-to-parallel registers (12?). These registers are then clocked into the CVSD chip using a divided down version of the BRC. The decoder is configured as four separate circuit boards; power having a plug P2 in FIG. 1c, timing and data extraction 50 and FIG. 6; demodulation having blocks 12, 14, 16 and 18 which are shown in detail in FIGS. 5 and 5a; and another for amplification and encoding (FIG. 4). A rotary switch (FIG. 4) is used to convert front panel selections to the required binary values for the counters.

1. The purpose of this section is a description of the technique and system used to encode/decode voice for PCM transmission.

2. For this system I have used the Harris HC-55564 CVSD modulator with a HC-5512D capacitive switching bandpass filter. The filter bandwidth is flat for 200 Hz≦f≦3.5 kHz. This unit performs as both a transmit and receive filter for the entire system. The CVSD converts voice into an NRZ signal using very low power digital filters in place of the analog for sample rates as low as 9 kbs, to and as high as 64 kbs. The digital filters require no external timing, which leaves only timing requirements for the bit rate of the output NRZ.

3. This CVSD Modulator varies the step size of the difference between the input signal (m(t)) and the feedback signal ($\overline{m}$(t)). The basic configuration uses a pulse modulator and a 3 bit algorithm driving an estimate filter. As the difference signal (Δm(t)) changes logic monitors the changes and applies a voltage (by use of a syllabic filter) to a digital modulator. This configuration allows for variable step sizes to follow the input, and give a closer approximation for each clock cycle. The slope changes of larger magnitude will result in a larger drive voltage on the signal estimate filter and hence a quicker response to the changes in forming the pulse coded output.

4. For this system to perform correctly, a synchronizing timing subsystem is required to lock onto the test data acquisition system of the instrumented aircraft. This is done in a simple manner by using the synchronizing pulse from the requesting parallel discrete interface (PDI) unit to activate the logic. Basically this pulse loads a counting system that track words in the data stream and bits in each word and loads the data bits into buffers or latches that the data acquisition system reads to capture the data. The counting will be described in detail in the next section.

Figure 2:
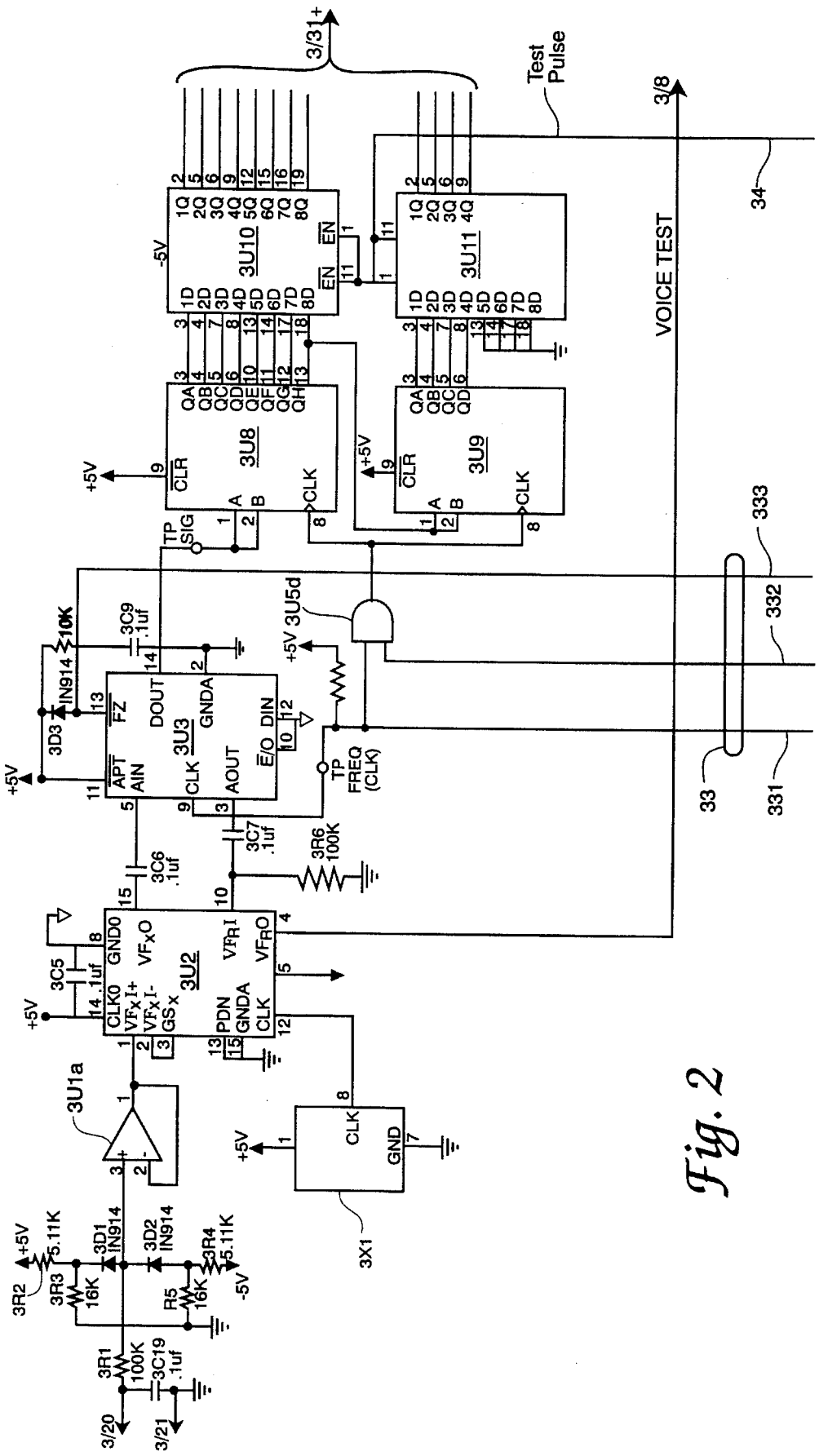

III. THE ENCODER (FIGS. 2 and 3)

1. The hardware used on the encoder PC card comprises the Voice modulator circuits 32 shown in FIG. 2, and the Sync circuits 34 shown in FIG. 3. The filter chip 3U2 may be Harris type 5512D or the equivalent Intel type 2912A. The CVSD chip 3U3 which performs the analog-to-digital conversion may be a Harris type HC-55564-5. The oscillator 3X1 may by a Connor-Winfield type S16R8. The Shift register chips 3U8 and 3U9 are type 54LS164J. In the embodiment shown in FIG. 2, the buffer chips 3U10 and 3U11 are type SN54373J parallel latches. In an alternative circuit, the chips 3U10 and 3U11 are type SN54LS244J tri-state buffers. The Op-amp chip comprising units 3U1a in FIG. 2 and 3U1b in FIG. 3 may be a Texas Instruments type TLO72.

Figure 3:
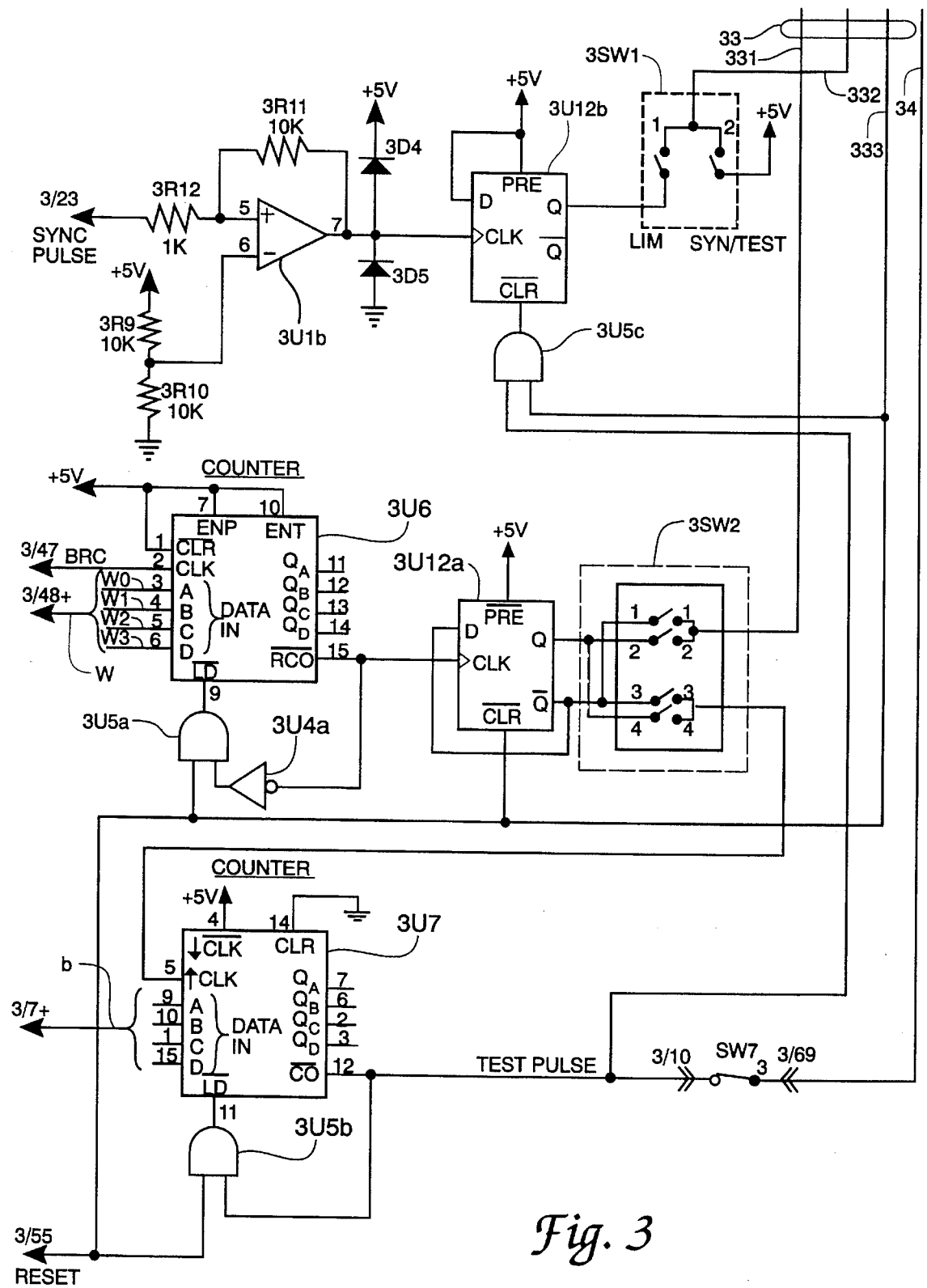

The Sync circuit 34 is shown in FIG. 3. In comprises two counter chips 3U6 type SN54LS163A, and 3U7 type SN54LS193J. The flip-flops 3U12a and 3U12b are on a type SN54LS74J chip. The circuits use type SN54LS04J inverters, and type SN54LS08J AND gates.

2. The PCM filter 3U2 as connected in FIG. 2 receives an analog voice frequency transmit input signal $VF_xI+$ at pin 1, forwards it via a transmit filter, and provides the voice frequency transmit output signal $VF_xO$ at pin 15. There is also a receive filter, with input $VF_RI$ at pin 10 and output $VF_RO$ at pin 4.

In the CVSD chip 3U3, when a reset signal at pin 13 goes low, it provides a force to zero (FZ) for the voice signal, and resets various internal circuits. Subsequently, analog input signals at pin 5 are converted to digital output signals at pin 14, with one bit out for each occurrence of a clock pulse at pin 9. The digital signals are also internally reconverted to analog and output at pin 3.

The method of synchronization is straight forward and simple. The request pulse from the ATIS or other test system 70 is received and stabilized via the Schmitt trigger 3U1b. The pulse is forwarded via the flip-flop 3U12a and contacts i of switch 3SW1 to line 332, and in FIG. 2 enables AND gate 3U5d. Then when clock pulses are received on line 331, they are supplied directly to the CVSD chip 3U3, and via the AND gate 3U5d to the clock input of the serial in/parallel out shift register comprising chips 3U8 and 3U9. Each time the clock signal transitions from low to high, the serial shift is activated, and a bit is shifted in from the output of the CVSD chip 3U3.

The word counter 3U6 is loaded with a 4-bit word from line W, which may be set either from switch SW1 via the binary encoder 42 in FIG. 1 or the dip switch 14SW1 in FIG. 1c. The bit counter 3U7 is loaded with a 4-bit word from line b (bit b3 being always zero), which may be set either from switch SW2 via the binary encoder 44 in FIG. 1a or the dip switch 14SW2 in FIG. 1c. (The word counter of the decoder is always set by rotary switch. The word counter for the encoder is always set by dip switch.)

The 4-bit binary word counter (and BRC divider) 3U6 (type SN54LS163A) will preset to the value on line W whenever the load signal at pin 9 is low and the clock signal BRC at pin 2 transitions from low to high. Both of the inputs (and therefore the output) of gate 3U5a are normally high. Initially when the RESET signal goes low, the counter is loaded when the clock signal goes high. Then on each subsequent clock signal BRC (with the load signal high) the count is advanced from the preset value until it reaches a value of 15 and the ripple carry out signal at pin 15 goes high. This causes a clock signal to be supplied to the flip-flop 3U12a, and also causes the load signal via inverter 3U4a and gate 3U5a to go low. The counter is now again loaded to the value from line W to start a new cycle. The flip-flop 3U12a is connected to divide the frequency by two, producing an output clock signal on every other input clock signal. The switch 3SW2 normally has the contacts 2 and 3 closed, and 1 and 4 open. The flip-flop is used to ensure a 50% duty cycle. It does this by "dividing by 2".

The 4-bit binary bit counter 3U7 (type SN54LS193J) is an up/down counter which will preset to the value on line b whenever the load signal at pin 11 is low. Both of the inputs (and therefore the output) of gate 3U5b are normally high. Initially when the RESET signal goes low, the counter is loaded. The counter is connected to use the up count signal at pin 5. On each subsequent clock signal (with the load signal high) the count is advanced from the preset value until it reaches a value of 15 and the carry out signal at pin 12 goes low. This causes a clock signal to be supplied via AND gate 3U5c to reset the flip-flop 3U12b. The clock pulse from unit 3U6 is also supplied via connector 3/10, contacts 3 of switch SW7, and line 34 to enable the latches 3U10 and 3U11 in FIG. 2 to cause the digitized voice signal word to be forwarded to the data acquisition system 70. The clock pulse from unit 3U7 also causes the load signal via gate 3U5b to go low. The counter is now again loaded to the value from line b to start a new cycle.

As an example of the external programming of the counters 3U6 and 3U7 via lines W and b respectively, if one wants to place the voice as the fourth word in every minor frame, the procedure is as follows:

Load the word counter/BRC divider 3U6 to 14 (16–4/2)*(This equation is due to the duty cycle flip-flop 3U12a doubling the bit period). This will then place a pulse into the bit counter 3U7 at a rate of:

$$fs = f(BRC)/4$$

where f(BRC) is the bit rate clock frequency. For example if f(BRC)=128 kbs, then $$fs = 32 \text{ kbs}.$$

Figure 9:
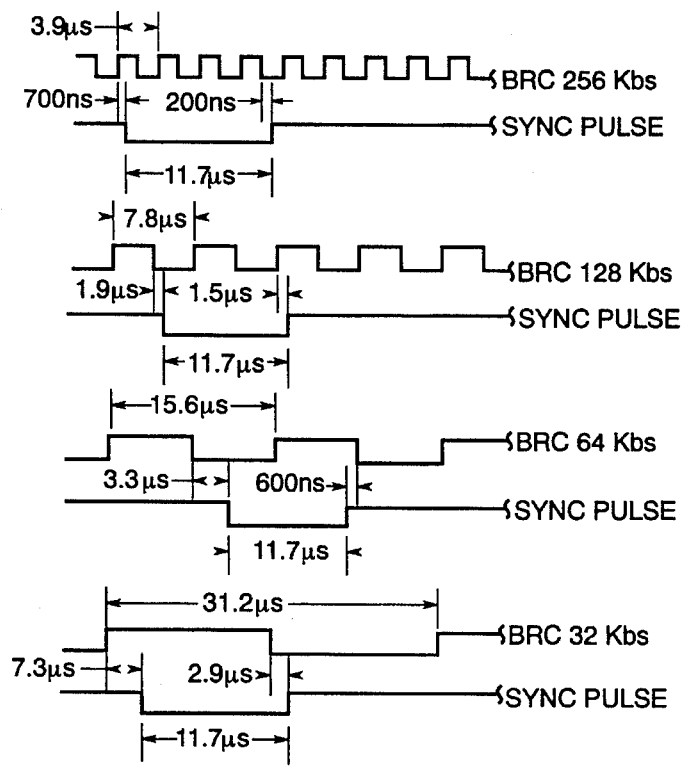
FIG. 9 is a voice encode timing diagram for the circuit of FIG. 3, with every eighth word placement.
Figure 9:
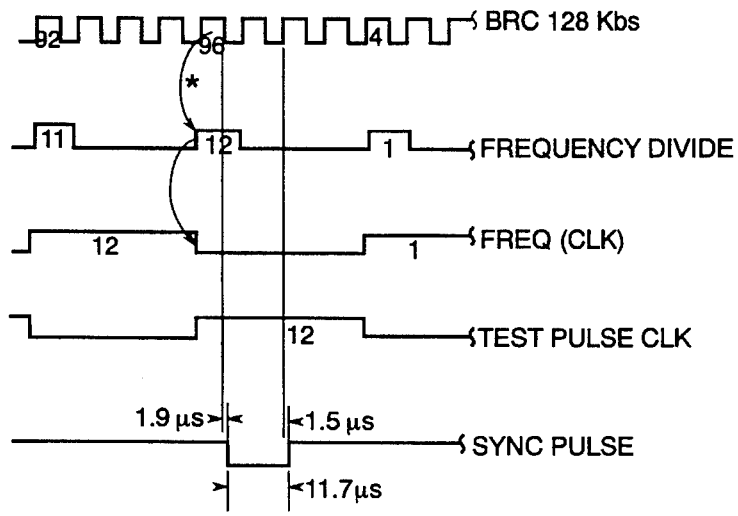
Figure 10:
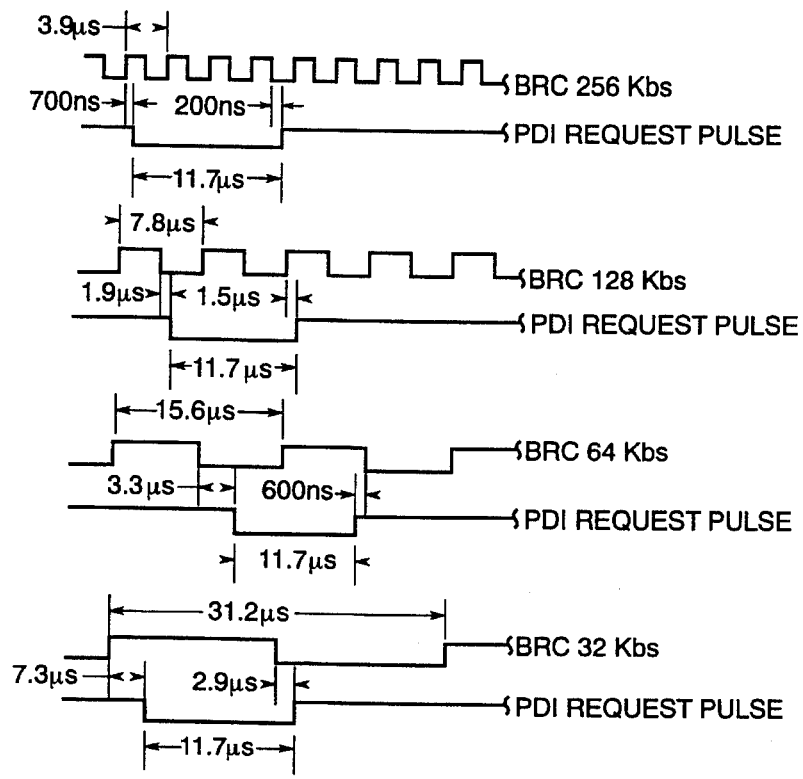
FIG. 10 is a voice encode timing diagram for the circuit of FIG. 3, with every fourth word placement.
Figure 10:
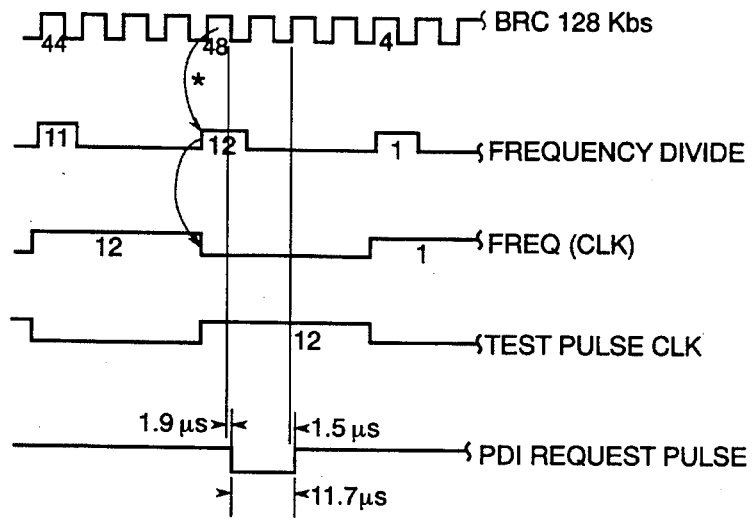

This bit rate now drives the bit counter 3U7 for 12=15–(4–1) bits (This equation relates a clock pulse rate to the clock rate of a preset asynchronous 54LS193 buffer). The request pulse allows for freedom from latch-up, and loading of the buffer unit or latch before the next request pulse. This assures a stability of the NRZ pulses, while voice quality is unaffected. (There is a –1 and –3 configuration of the encoder. The –3 used 54LS373 latches as shown in FIG. 2 in place of the 54LS244 buffers. There is also a clock phase that is not available on the –1. The clock phase switch 3SW2 allows for 180° shift in the sample clock and for a 180° phase difference between the sample clock and the bit counter.) See timing diagram in FIG. 9 for the embodiment with 54LS244 buffers, or in FIG. 10 for the embodiment with 54LS373 latches. The requesting pulse arrives every $$\frac{\text{Bit rate clock freq.}}{(\text{word location})(\text{bits/word})} = \frac{f(BRC)}{(WDL)(BPW)} = S_r$$

In this example:

$$\frac{128 \text{ kb/s}}{(4wd)(12b/wd)} = 2.67 \text{ kHz} = S_r$$

or $$T_r = \frac{1}{S_r} = 375 \text{ μs}$$

This allows for smooth, continuous operation with very little discernible degradation of the signal quality.

NOTES

1. For best quality of voice, the system must run at 9 kbs≦$f_s$≦64 kbs. If you desire to place voice at every 16th word, then a minimum bit rate clock (BRC) of 256 kbs is required. If you want voice every other word then a maximum rate of 128 kbs is required, etc..

2. In one configuration the bit counter is really redundant for encoding since synchronization assures word length. (It is also included for test purposes in the decoder, which incorporates the encoder just for a test configuration, see below). In a second configuration it is required to count bits.

IV DECODER

Figure 5:
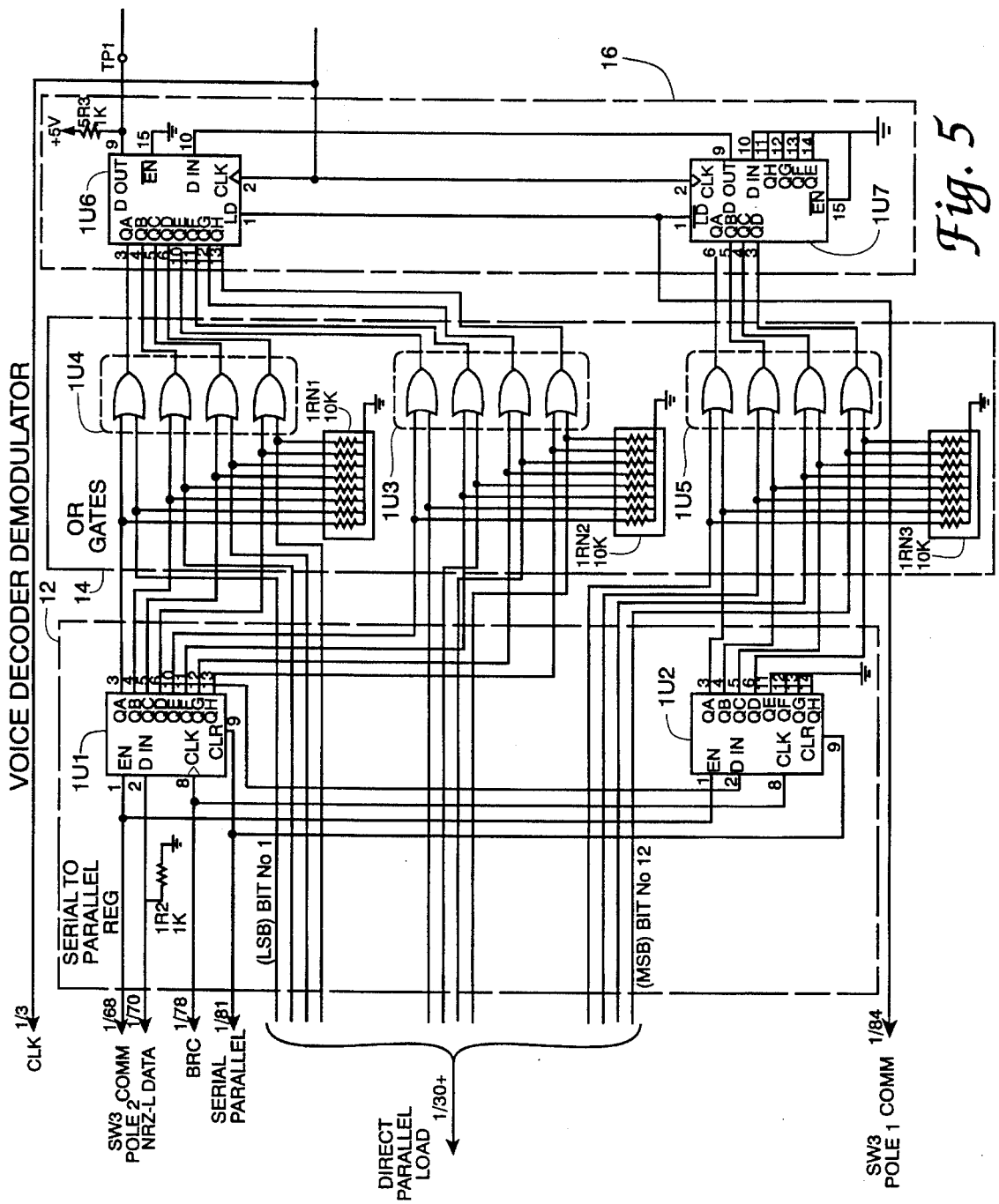
FIGS. 5 and 5a (with FIG. 5a arranged to the right of FIG. 5) comprise a functional block and schematic diagram of a voice decoder demodulator PC card, including the serial-to-parallel register 12, the OR gates 14, the parallel-to-serial register 16, and the voice demodulator 18 of FIG. 1b.

1. The voice decoder demodulator PC board comprises the serial-to-parallel register 12, the OR gates 14, the parallel-to-serial register 16, and the voice demodulator 18 shown in FIG. 1b. As shown in FIG. 5, the serial-to-parallel register comprises two type SN54LS164 chips 1U1 and 1U2. Enable inputs at pin 1 are from the connector 1/68, clock inputs at pin 8 are on lead BRC via connector 1/78, and clear inputs at pin 9 are from the connector 1/81. Data input for the first chip 1U1 is supplied via connector 1/70. The parallel outputs are connected to inputs of the OR gates 14, which comprise three type SN54LS32 chips 1U3, 1U4 and 1U5, with 10K load resistors 1RN1, 1RN2 and 1RN3 to ground for the inputs. (The OR gates allow for serial-to-parallel or direct parallel feeds.)

The parallel-to-serial register 16 comprises two type SN54LS165 chips 1U6 and 1U7. The parallel inputs are from outputs of the OR gates 14. The load inputs at pin 1 are from connector 1/84. The clock inputs at pin 2 are from connector 1/3. The enable inputs at pin 15 are grounded. The serial output from pin 9 of chip 1U7 goes to the data in at pin 10 of chip 1U6, and the data out from pin 9 of chip 1U6 goes via test point TP1 to pin 12 of the delta modulator 1U8 in FIG. 5a.

Figure 5A:
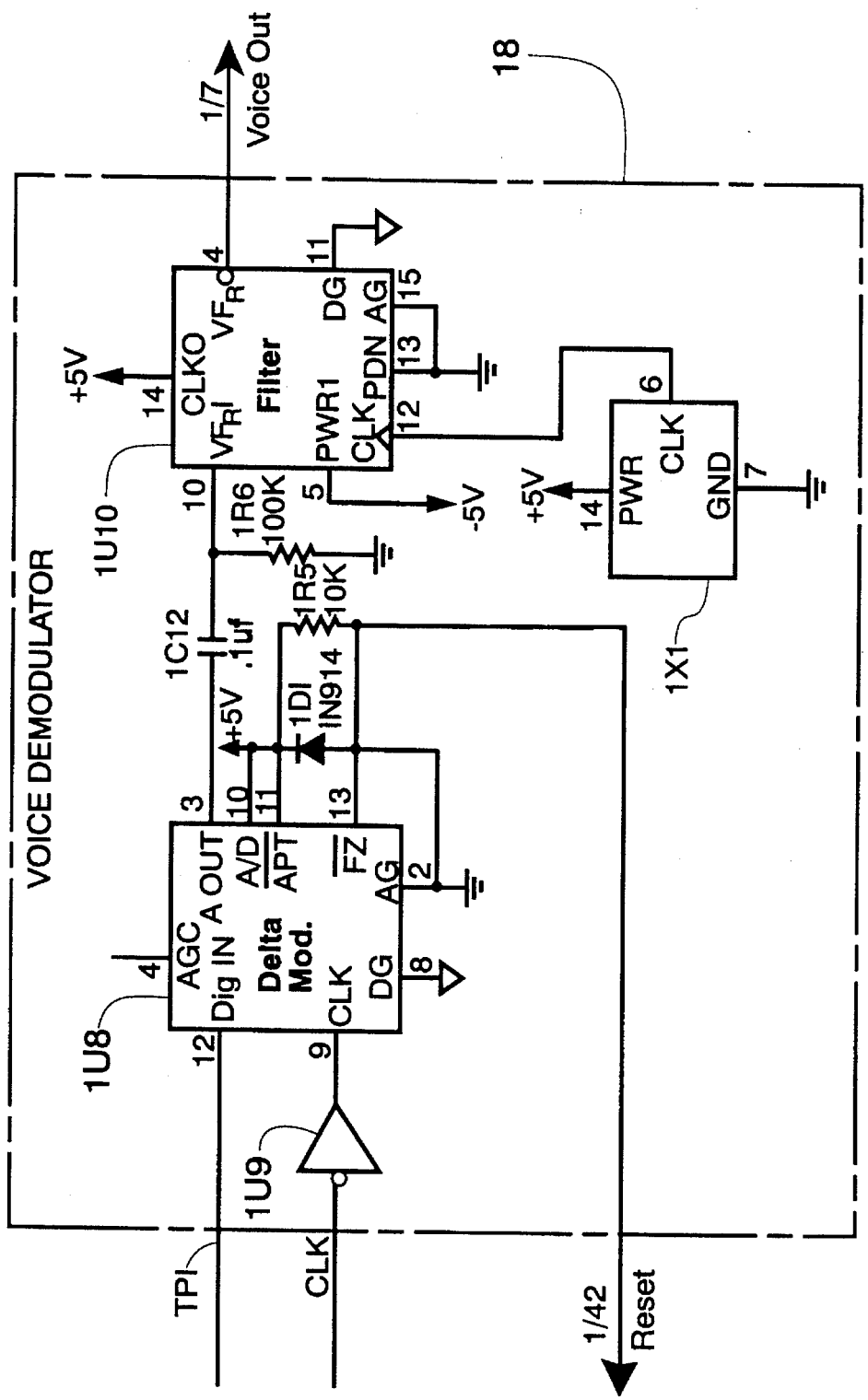

The voice demodulator 18 as shown in FIG. 5a comprises a Harris type 55564 CVSD chip 1U8 set to operate as a digital-to-analog converter, and a Harris type HC12912A filter chip 1U10. There is also an oscillator chip 1X1 Conner-Winfield type S16RS connected to the clock pin 12 of the filter chip 1U10. The digital input signals at pin 12 of chip 1U8 are converted to analog signals and output at pin 3. They then go via capacitor 1C12 to pin 10 of the filter 1U10, and are output at pin 4 to the connector 1/7. The clock signals from connector 1/3 in FIG. 5 go via an inverter 1U9 in FIG. 5a to pin 9 of the chip 1U8. The reset line from connector 1/42 goes to pin 13 of the chip 1U8 to provide a force zero and reset function.

The hardware of the PC board for the voice decoder timing unit 50 is shown in FIG. 6. There are three up/down binary counters 5U1, 5U5 and 5U9 of type SN54LS193; and one binary counter 5U9 of type SN54LS163. Four flip-flops 5U4a, 5U4b, 5U7a and 5U7b are D type SN54LS74 (These flip-flops ensure 50% duty cycle). A monopulse chip 5U6 is type SN54LS123. The inverters and AND gates are type SN54LS04 and SN54LS08 respectively.

The counter 5U9 is used as a bit rate divide counter. It is loaded with the 4-bit word from line W via connector 5/25+. The load command is initially provided from the reset line via gate 5U2d. The BRC clock pulses via connector 5/30 advance the count from the loaded W value up to the value of 15, at which time an output pulse is generated at the RCO pin 15, which via inverter 5U3d and gate 5U2d reloads the W value to start a new cycle. The output pulse is also supplied to the clock input of a flip-flop 5U7a, which repeats the pulse via switch 5SW2, test point TP3 and connector 5/3. The pulse then goes via connector 1/3 (FIG. 1b) to the parallel-to-serial register 16 (FIG. 5) and the and the CVSD chip 1U8 (FIG. 5a).

The counters 5U1 and 5U5 in tandem form a word counter. The 4-bit word from line W is provided as input to the counter 5U1, and the 4-bit output word from counter 5U1 is provide as input to the counter 5U5. The reset signal clears the counter 5U5 via an inverter 5U3c. The chip 5U6 is a dual retriggerable one-shot. The reset signal is supplied as an input to the first one-shot unit at pin 1, and the resulting output pulse at pin 4 is supplied as an input to the second one-shot unit at pin 10. The output pulse from the first unit also goes to the load input at pin 11 of counter 5U1 to cause the W value to be loaded. The output pulse from the second one-shot goes to the down clock of counter 5U1 (A asynchronous counter is needed for bits where I previously used a synchronous counter. Since the asynchronous counter doesn't wait for a clock pulse to reset I need to count one additional pulse, or equivalently, load the bit count valueminus one.). The frame rate clock signal FRC via connector 5/2 goes to the clock input of flip-flop 5U7b, and the output of that flip-flop via an inverter 5U7b and gate 5U2b loads the counter 5U5. The word rate clock signal WRC via connector 5/38 goes to the clock input of flip-flop 5U4a, and the output pulse from that flip-flop goes via switch 5SW1 and test point TP1 to the up clock input at pin 5 of counter 5U5. Upon reaching a count value of 15, counter 5U5 generates a pulse at the carry out pin 12, which via gate 5U2b reloads the counter to start a new cycle. The output pulse also goes to connector 5/34, to the load input at pin 11 of counter 5U8, and to the clock input of flip-flop 5U4b. The output of flip-flop 5U4b provides an enable input to an AND gate 5U2c for the up clock input of counter 5U8, and also via connector 5/23 In FIG. 1b, when switch SW3 is in the WCS2 position the signal is forwarded via connector 1/68 to provide an enable signal to the serial-to-parallel register 12 (comprising chips 1U1 and 1U2 in FIG. 5).

Counter 5U8 is used as a bit counter. This counter is cleared by the reset signal via an inverter 5U3b. The word from line b is loaded in response to the pulse from counter 5U5. With gate 5U2c enabled by the signal from flip-flop 5U4b, the bit rate clock pulse BRC from connector 5/30 via an inverter 5U3a will cause the counter 5U8 to count up to the value of 15, and generate an output pulse at the carry out pin 12. This pulse will clear the flip-flop 5U4b, and to connector 5/16. In FIG. 1b, switch SW3 in the WCS2 position will forward the signal via connector 1/84 to the parallel-to-serial register 16. As shown in FIG. 5, this connector 1/84 is connected to the load input of the chips 1U6 and 1U7.

The method of decoding is simply the reverse of the encoding scheme. There is additional circuitry to synchronize in five different ways, but the hardware is essentially the same. We shall briefly examine each decoding method separately.

2. The first synchronization technique allows for a serial feed of data from the PCM stream. The timing is identical to the encoder with a one word counting clock (counters 5U4 and 5U5), a bit rate divide counter 5U9 and a bit counter 5U8. The decommutated serial stream enters a serial to parallel register 12 (chips 1U1 and 1U2) (SN54164J) on que from the word count register 5U5 (with switch SW3 in the WCS1 or WCP position). Then if necessary the bit counter 5U8 counts the number of bits in the word, latches these bits into a parallel to serial register 16 (chips 1U6 and 1U7) (SN54165J) which in turn are clocked into the HC-55564 decoder 1U8 at the divided frequency. The word location and bits per word are programmable via binary encoders external rotary switches SW1 and SW2 in FIG. 1a. These switches and additional circuits will be discussed further in the section on the decoder box. There exists a means to accept serial data with a word strobe available (i.e. word pulses don't have to be counted). This alternate condition is selectable from the front panel on the box. Internally, the word counter 5U1 and 5U5 is bypassed and the word pulse activates a gate at the EN inputs of devices 1U1 and 1U2 in unit 12 from strobeson switch SW3, which allows access for the serial data to the serial-to-parallel registers. The transfer of bits from stream, to registers, to decoder proceeds as discussed above.

3. Another means of decoding is via a parallel feed that bypasses the serial registers. All transfers proceed as described previously. Again, there are two alternate word count possibilities. The first method counts presented word pulses. The second latches data simultaneously with a word strobe. The transfer schemes are similar to the serial transfer.

V THE DECODER BOX

1. The decoder has two modes; the decoder and the test mode. In this section a brief explanation of the internal (INT) test circuit and the front panel switches is given.

2. The operation of the test circuit is easy. With the power switch SW8 in FIG. 1b on, turn the switches SW6 and SW7 in FIGS. 1b and 1c labeled "test" to on and INT (internal). Plug in mic in the mic jack MJ1 in FIG. 1a (with or without headset), turn speakers switch SW4 on or off (depending on availability of headsets with microphone capabilities). When speaking into the mic your voice is digitized in the voice modulator 32, parallel transferred from the encoder via line PDI, the OR gates 14, and the parallel-to-serial register 16 to the voice demodulator 18 on que from a test pulse. The bits are now clocked out of the parallel-to-serial register 16 at the divided down clock rate, then transformed back to analog, then amplified. The amplifier also contains a automatic gain control (AGC) circuit 46 to limit the energy through the switching capacitive voice filter. The voice level is limited to approximately 1.1. volts pp. What you hear is the processed voice. There is a volume adjust R3 on the panel clearly marked, if needed.

Switches SW1 and SW2 labeled bits per word, and word location, should be turned to the desired values. These values are programmed, via a rotary switch and encoder 42 and loaded into the appropriate counters.

VI SUMMARY

The voice encoder/decoder subsystem is an easy to use peripheral item for any instrumentation system. It requires minimal user interface to operate the only additional equipment item required is the standard decommunicator, DSI 7103, or a similar model, used by the Mod Dock and the CTF's. Its five schemes of decoding allow for easy integration into any data acquisition system we are now employing.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A subsystem to integrate voice into a data acquisition system pulse code modulation (PCM) stream for digital data having bits controlled by a bit rate clock (BRC), with an acquisition format in which the bits are organized into words with a given number of bits per word controlled by a word rate clock (WRC), and the words are organized into frames with a given number of words per frame controlled by a frame rate clock (FRC), words being identified for a type of data by their placement in the frame;

wherein said subsystem uses continuously variable slope delta-modulation (CVSD), comprising a CVSD encoder device operated as an analog-to-digital converter, an analog input of the CVSD encoder device being coupled to a source of voice signals, encoder register means having a data input coupled to a digital output of the CVSD device, and an encoder register clock input for clock pulses to serially shift digital data bits from the digital output of the CVSD encoder device into the encoder register means;

encoder synchronization means comprising an encoder word counter, means for loading the encoder word counter with a selected word value to determine placement of PCM voice words in said frames, the encoder word counter having a clock input coupled to the data acquisition system to receive BRC pulses and controlled to count from said selected word value to a given value and then output a clock pulse at a pulse output, means coupling the pulse output to means for generating encoder clock pulses and supplying them to a clock input of the CVSD encoder device and also to an encoder control gate, the encoder control gate having an enable input coupled to receive request pulses from the data acquisition system, so that when the request pulse is received the CVSD encoder device and the encoder register means are enabled to generate and load a PCM voice word from the CVSD encoder device into the encoder register means, and encoder output control means including means setting the given number of bits per word and means for causing a word which has accumulated said given number of bits to be transferred from the encoder register means to the data acquisition system;

whereby the encoder subsystem uses the bit rate clock (BRC) from said data acquisition system for all timing in said subsystem, with other clocks of the subsystem being divided down from the BRC and a request pulse from said data acquisition system.

2. A subsystem according to claim 1, wherein the encoder synchronization means further includes an encoder bit counter, means for loading the encoder bit counter with a selected bit value to determine said given number of bits per word, the encoder bit counter having a clock input coupled to said pulse output of the encoder word counter and controlled to count from said selected bit value to a given value and then output a clock pulse which enables the transfer from the encoder register means to the data acquisition system.

3. A subsystem according to claim 1, wherein the CVSD encoder device includes means converting the digital output signals back to analog form at an analog output terminal, and means coupling the analog output terminal via amplifier means to sound transducer means, to thereby provide a test of the quality of the digitized signals.

4. A subsystem according to claim 1, which further includes decoder means, including a CVSD decoder device operated as a digital-to-analog converter, decoder register means having data input means, means for selecting a principal decode mode or a built-in-test mode, so that in the principal decode mode the data input means is coupled to receive data from the data acquisition system, and in the built-in-test mode the data input means is coupled to a data output of the encoder register means to provide a test of the encode and decode operations, the decoder register means having a serial data output coupled to a digital input of the CVSD decoder device, an analog output of the CVSD decoder device being coupled via amplifier means to transducer means for reproducing the voice signals;

decoder synchronization means comprising a bit rate divide counter and a decoder word counter, means coupled to the FRC of the data acquisition system for loading the decoder word counter with a selected word value to locate the placement of PCM voice words in said frames, means coupling the WRC of the data acquisition system to a clock input of the word counter to cause the word counter to count the words to a preprogrammed value, and then supply a signal to load control input means for controlling the loading of data words into the decoder register means;

means for loading the bit rate divide counter with said selected word value, the bit rate divide counter having a clock input coupled to the data acquisition system to receive BRC pulses and controlled to count from said selected word value to a given value and then output a clock pulse at a bit rate pulse output to means for generating decoder clock pulses and supplying them to a clock input of the CVSD decoder device and also to the decoder register clock input to serially shift digital data bits from the serial data output of the decoder register means to the digital input of the CVSD decoder device.

5. A subsystem to decode voice from a data acquisition system pulse code modulation (PCM) stream for digital data having bits controlled by a bit rate clock (BRC), with an acquisition format in which the bits are organized into words with a given number of bits per word controlled by a word rate clock (WRC), and the words are organized into frames with a given number of words per frame controlled by a frame rate clock (FRC), words being identified for a type of data by their placement in the frame;

wherein said subsystem uses continuously variable slope delta-modulation (CVSD), including a CVSD decoder device operated as a digital-to-analog converter, decoder register means having data input means coupled to receive data from the data acquisition system, the decoder register means having a serial data output coupled to a digital input of the CVSD decoder device, an analog output of the CVSD decoder device being coupled via amplifier means to transducer means for reproducing the voice signals;

decoder synchronization means comprising a bit rate divide counter and a decoder word counter, means coupled to the FRC of the data acquisition system for loading the decoder word counter with a selected word value to locate the placement of PCM voice words in said frames, means coupling the WRC of the data acquisition system to a clock input of the word counter to cause the word counter to count the words to a preprogrammed value, and then supply a signal to load control input means for controlling the loading of data words into the decoder register means;

means for loading the bit rate divide counter with said selected word value, the bit rate divide counter having a clock input coupled to the data acquisition system to receive BRC pulses and controlled to count from said selected word value to a given value and then output a clock pulse at a bit rate pulse output to means for generating decoder clock pulses and supplying them to a clock input of the CVSD decoder device and also to the decoder register clock input to serially shift digital data bits from the serial data output of the decoder register means to the digital input of the CVSD decoder device;

whereby the decoder subsystem uses the bit rate clock (BRC) from said data acquisition system for all timing in said subsystem, with other clocks of the subsystem being divided down from the BRC.

* * * * *